United States Patent
Strutz et al.

(10) Patent No.: US 6,487,004 B1
(45) Date of Patent: Nov. 26, 2002

(54) OPTICAL IMAGE REJECT DOWN CONVERTER

(75) Inventors: Shane J. Strutz, Columbia, MD (US); Keith J. Williams, Dunkirk, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 157 days.

(21) Appl. No.: 09/635,985

(22) Filed: Aug. 9, 2000

(51) Int. Cl.[7] ................................................. G02F 2/02
(52) U.S. Cl. ........................ 359/326; 359/191; 359/245
(58) Field of Search ................................. 359/115, 124, 359/127, 132, 245, 325–332, 191

(56) References Cited

U.S. PATENT DOCUMENTS

| | | | |
|---|---|---|---|
| 4,259,746 A | 3/1981 | Sandstedt | 359/145 |
| 4,794,351 A | * 12/1988 | Darcie | 359/245 |
| 5,016,242 A | * 5/1991 | Tang | 359/124 |
| 5,457,557 A | 10/1995 | Zarem et al. | 359/121 |
| 5,617,239 A | * 4/1997 | Walker | 359/181 |
| 5,739,938 A | 4/1998 | Goutzoulis et al. | 359/187 |
| 5,826,174 A | 10/1998 | Vu | 455/42 |

OTHER PUBLICATIONS

Kamitsuna et al, "Monolithic Image–Rejection Optoelectronic Up–Converters That Employ The MMIC Process", IEEE Transactions on Microwave Theory and Techniques, vol. 41, No. 12, Dec. 1993, pp. 2323–2329.*

Chao et al, "Photonic Mixers And Image–Rejection Mixers For Optical SCM Systems", IEEE Transactions on Microwave Theory and Techniques, vol. 45, No. 8, Aug. 1997, pp. 1478–1480.*

Ward et al, "An Ultrawideband Image Rejecting Microwave Downconverter Using WDM", 1999 International Topical Meeting On Microwave Photonics (MWP '99), vol. 1, pp. 239–242, Paper F–9.6, Melbourne Australia, Nov. 17–19, 1999.*

Strutz et al, "Demonstration of A Wide–Band Image Rejection Microwave Downconverter", IEEE Photonics Technology Letters, vol. 12, No. 6, Jun. 2000, pp. 687–689.*

Strutz et al, "A 6 to 11 GHz All–Optical Image Rejection Microwave Downconverter", 2000 International Topical Meeting on Microwave Photonics (MWP 2000), Oxford UK, Paper TU2.6, pp. 74–77, Sep. 11–13, 2000.*

* cited by examiner

Primary Examiner—John D. Lee
(74) Attorney, Agent, or Firm—John J. Karasek; John G. Mills, III

(57) ABSTRACT

The optical image reject down converter maps a received radio frequency (RF) into an arbitrary intermediate frequency range and precludes interference between the received signals. A received radio frequency signal is downconverted into an intermediate frequency band for use by an electronic circuit in other devices. Optical light is divided, in a first path light is transferred into an optical sideband by a first optical modulator or phase modulator. Light in a second path is converted into 18 GHz sidebands. The signal is amplified and additional sidebands are generated by a received 9 GHz signal. The filtered sideband is heterodyned with the 25 GHz signal of path one, resulting in downconversion to 2 GHZ. Image frequencies which are present in the optical link are filtered and are rejected.

15 Claims, 3 Drawing Sheets

OPTICAL IMAGE REJECT DOWN CONVERTER

BACKGROUND OF THE INVENTION

1. Field of the Invention

This invention is generally an optical down converter for the mapping of received radio frequencies into an arbitrary intermediate frequency range while precluding interference between the received signals and more specifically a device for improving image rejection to improve the harmonic spurs limiting system performance.

2. Description of the Related Prior Art

Currently there are primarily two types of image rejection systems that provide significant frequency translation. These are those which use a digital phase modulator to produce a serrodyne phase modulated waveform, and those which split a received signal into two parts and then recombine them in such a way as to eliminate the unwanted image and carrier frequencies. Optical image rejection mixers that utilize the serrodyne method of frequency translation apply a sawtooth waveform to phase modulate the optical signal, thereby causing the optical frequency to shift. The achievable image rejection is limited by the number of discrete bits that can be implemented by the digital phase modulator when approximating the sawtooth waveform. This limits the image rejection to approximately 25 dB.

In the case of microwave image rejection mixers, the achievable image rejection is limited by the need for near perfect amplitude and phase control. As shown in FIG. 1, a received radio frequency)(RF) signal 124 is first divided into two signals 106 and 108 in a in-phase power divider 122, mixed in associated mixers 112 and 114 with a local oscillator input 102 (LO IN) and split into associated signals 106 and 108 that are shifted 90° in a first 3 dB 90° hybrid power divider 122. The output of the mixers 112 and 114 are then recombined with a 90° phase shift between the two components in a second 3 dB 90° hybrid power divider 126 and output as an intermediate frequency band 134. Exact amplitude and phase matching with broad band signals is nearly impossible with strictly microwave components since the frequency response of each component varies. A typical device, with a 3° phase error and a 0.25 dB amplitude imbalance upon recombination, is limited to about 36 dB of image and carrier rejection. Further details on serrodyne frequency shifting can be found in Johnson et al., SERRODYNE OPTICAL FREQUENCY TRANSLATION WITH HIGH SIDEBAND SUPPRESSION, J. of Lightwave Tech., Vol. 6, No. 6, pg. 109, 1988.

A recently developed optical image rejection downconverter with >60 dB of image rejection was recently developed and utilizes an electronic mixer to upconvert signals into the passband of a bandpass filter followed by optical downconversion of the filtered signals into a desired output band, as shown in FIG. 2. SEE, U.S. patent application Ser. No. 09/620,0324, by Ward et al., entitled IMAGE REJECTING MICROWAVE PHOTONIC DOWNCONVERTER, Navy Case No. 79,800, filed Jul. 17, 2000. This device allows telecommunications systems to downconvert the lower sideband of densely multiplexed ultrawideband bandwidth channels into low frequency bands where conventional electronics can perform signal processing functions; has the image rejection (>60 dB) to provide unambiguous signals for direction finding applications; and exhibits efficient image rejection that should permit multi-octave microwave frequency reception and compression. In addition, that invention is intrinsically remoteable, and due to the various optical and electrical components that they may be used to construct the invention contained in this application. However, the invention in Ward et al. utilizes a first local oscillator frequencies below the original frequency of a bandpass filter that may allow harmonics from the local oscillator to convert undesired input radio frequency (RF) frequencies into spurious signals presenting the output intermediate frequency band being applied to user electronics. These harmonics can be handled by the user electronics but additional signal processing would be required. It would be preferable to prevent such harmonics from reaching the user electronics.

SUMMARY OF THE INVENTION

The object of this invention is to is to provide an apparatus for the improvement of image rejection in image rejection mixing systems while removing harmonic spurs.

Another object of this invention is to provide a device having sufficiently large image rejection capability so as to allow precise determination of frequency for direction finding applications.

These and other objectives are accomplished by the all optical image reject down converter which maps received radio frequency (RF) into an arbitrary intermediate frequency (IF) range, while precluding interference between the received signals. The invention converts a received radio frequency signal into an arbitrary intermediate frequency for use by an electronic circuit in other devices. An example of the systems ability to convert a received 9 GHz signal into a 2 GHz intermediate frequency follows. Optical light originating from a laser is divided into two paths. Light in a first path is transferred into an optical sideband by a first optical modulator (MZM1) or phase modulator (LO1=25 GHz). At the same time, light in a second path is converted into 18 GHz sidebands by a second optical modulator (MZM2). The signal is amplified and additional sidebands are generated by a received 9 GHz signal. At this point, the optical spectrum in the second path consists of many optical wavelengths. Next, the light is passed through a narrow-band optical filter that is tunable which selects the 27 GHz sideband. Ideally, the optical spectrum of the second path consists only of light at the frequency equal to the original laser frequency plus the 27 GHz signal. Finally, the filtered sideband is recombined (heterodyned) with the 25 GHz signal of path one, resulting in downconversion to a 2 GHz signal. The use of a narrow-band optical filter allows the system to select a particular sideband for use in the heterodyne downconversion. As a result, image frequencies present in the optical link are filtered out and are rejected. The image rejection of the system is a function of filter extinction.

DESCRIPTION OF THE PREFERRED EMBODIMENT

Figure 1:
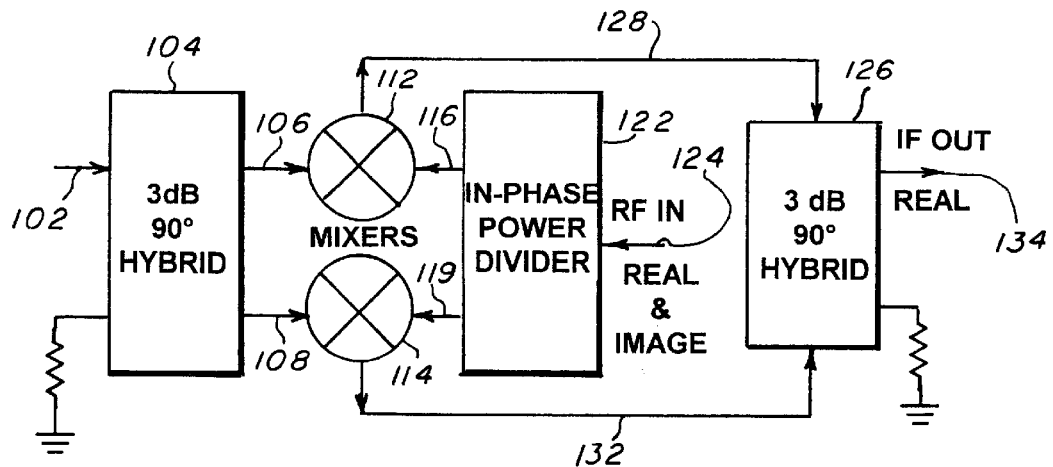
FIG. 1 shows a block diagram of an electronic image reject system present in the prior art.
Figure 2:
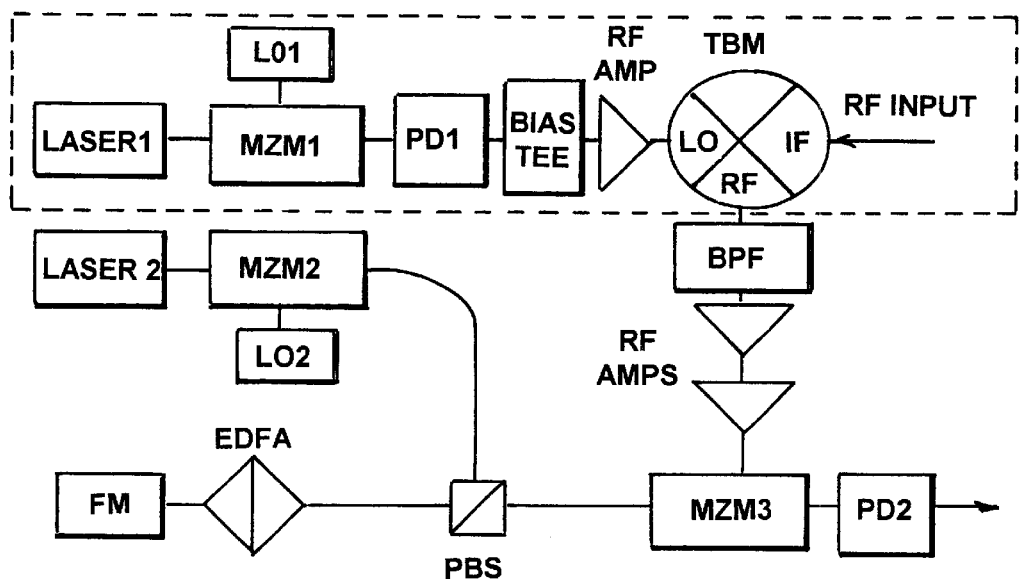
FIG. 2 shows a hybrid optical fiber/electronic image rejection downconverter of the prior art.
Figure 3A:
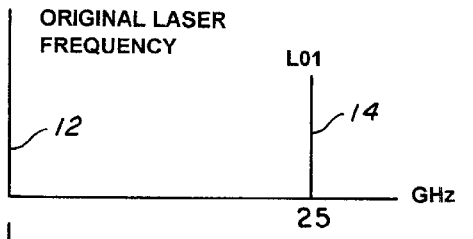
FIG. 3a shows a schematic of light originating from a laser transferred into an optical sideband by a Mach-Zehnder modulator.
Figure 3B:
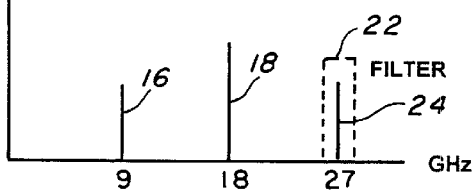
FIG. 3b shows a light signal that has been amplified and with additional sidebands generated by a received 9 GHz signal.
Figure 3C:
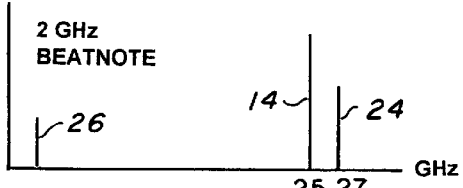
FIG. 3c shows a filtered sideband heterodyned with a 25 GHz signal resulting in downconversion to 2 GHz.

The general operational principles of this invention are depicted in FIGS. 3a through 3d and the procedure whereby the system converts a received 9 GHz signal into a 2 GHz intermediate frequency for use by an electronic circuit in other devices. An optical light 12 originating from a laser is divided into two paths. Light in a first path is transferred into an optical sideband by a first optical modulator (MZM1) or phase modulator (LO1=25 GHz 14, as shown in FIG. 3a). At the same time, light in a second path is converted into 18 GHz sidebands 16 by a second optical modulator (MZM2). The signal is amplified and additional sidebands are generated by a received 9 GHz signal 18 (as shown in FIG. 3b). At this point, the optical spectrum in the second path consists of many optical wavelength. Next, the light is passed through a narrow-band optical filter 22 that is tunable which selects the 27 GHz sideband 28 (as shown in FIG. 3b). Ideally, the optical spectrum of the second path consists only of light at the frequency equal to the original laser frequency 12 plus the 27 GHz signal 24. Finally, the filtered sideband is heterodyned with the 25 GHz signal 14 of path one, resulting in downconversion to a 2 GHz signal.

Figure 3D:
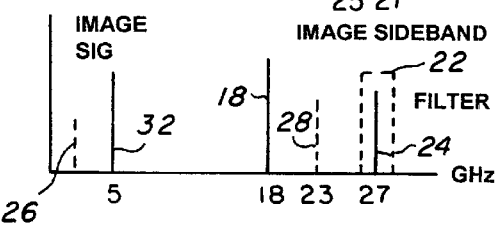
FIG. 3d shows a radio frequency (RF) input at 5 GHz mixed with an 18 GHz sideband from a local oscillator to produce a 23 GHz sideband which is rejected by the optical filter.
Figure 4:
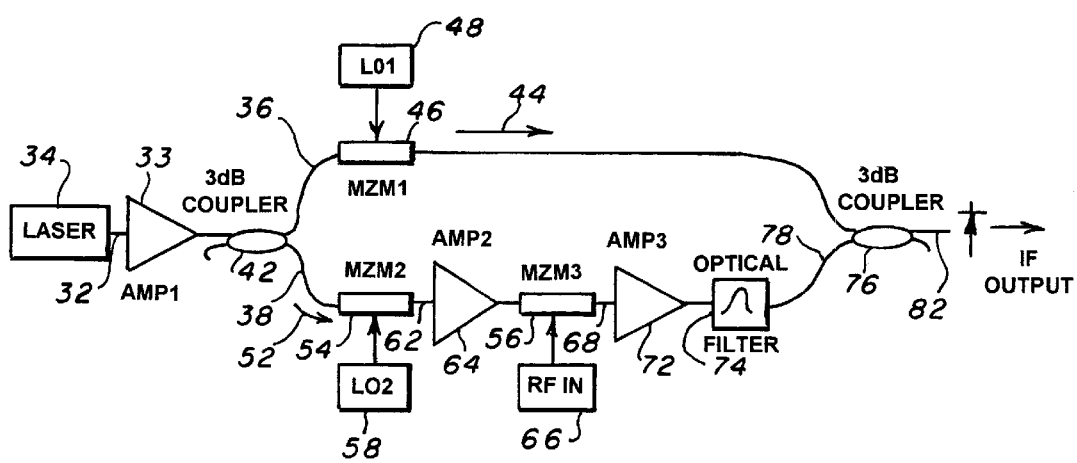
FIG. 4 shows a block diagram of the all-optical image reject down converter set forth in the primary embodiment of this invention.

The use of a narrow-band optical filter 22 allows the system to select a particular sideband for use in the heterodyne downconversion. As a result, image frequencies 26 and 28 present at the radio frequency (RF) signal output of the filter 22 are rejected. For example, an RF input of 5 GHz signal 32 mixes with the 18 GHz (from a second local oscillator (LO2)) sideband 18 to produce a 23 GHz sideband 28, as shown in FIG. 3d. Without the filter 22 present, this would generate a duplicate 2 GHz signal 26, as an image, at the output. Thus, the image rejection of the system is a function of filter 22 extinction.

Figure 5:
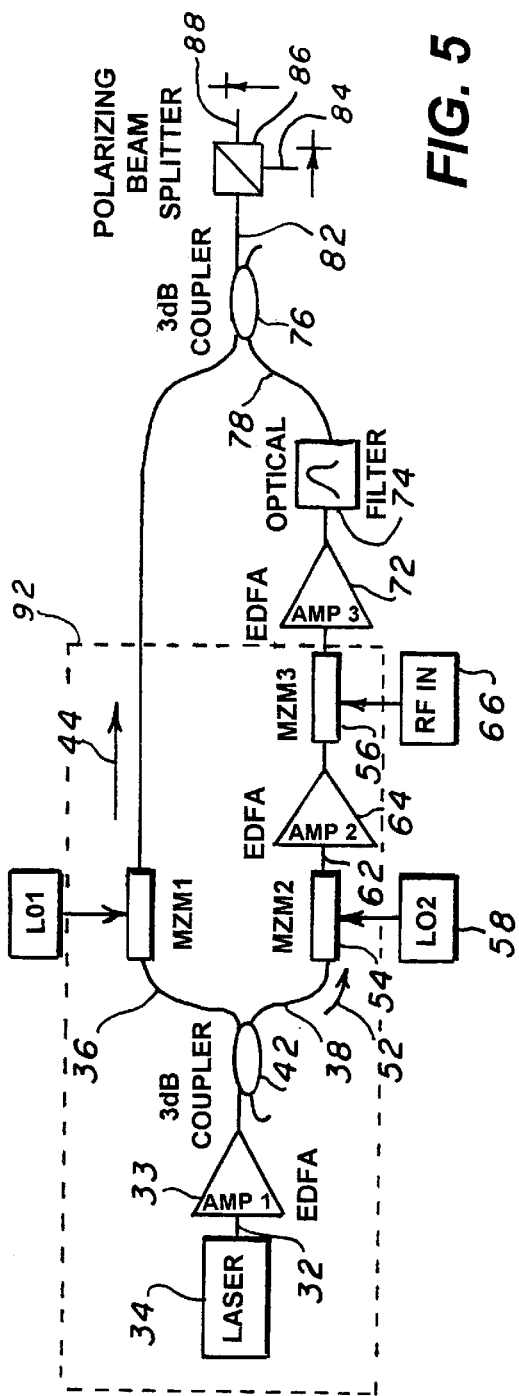
FIG. 5 shows a block diagram of the optical image reject down converter with a polarization diverse output as set forth on a second primary embodiment allowing for the use of single-mode optical fibers after the modulators.
Figure 6:
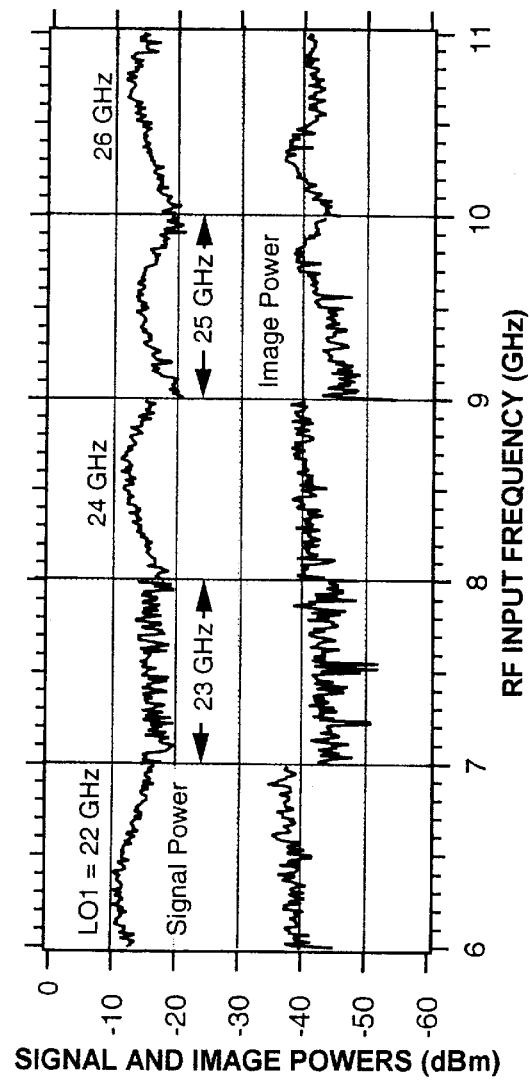
FIG. 6 shows a plot of conversion loss versus image signal powers with a RF input power of +20 dBm.

In a first preferred embodiment, an optical image reject down converter 10, as shown in FIG. 5, light 32 at a frequency of approximately 1550 nm from a fiber coupled laser light source 34 (however, lasers of any wavelength may be utilized) is amplified in a first optical amplifier 33 and divided into two paths 36 and 38 by a first 3 dB polarization maintaining (PM) optical coupler 42. The light source 34 may be of any type that can be used to downconvert radio frequency (RF) frequencies through optical heterodyning and the optical amplifier 33 is optional and may be omitted. In a first path 44, the light 32 is amplitude modulated by a first optical modulator (MZM1) 46 which is driven with a first local oscillator (LO1) 48 operating at a frequency of approximately 2–26 GHz. Virtually, frequency band may be chosen >100 GHz so long as the proper combinations of LO1 48 and LO2 58 frequencies is used. The amplitude modulation causes light to be shifted from the fundamental beam 32 into the RF sidebands.

The second path 52 utilizes two cascaded optical modulators (MZM2) 54 and MZM3) 56. MZM2 54 modulates the light 32 at 18 GHz with a second local oscillator (LO2) 58 causing the generation of optical sidebands. The light 62 is then amplified in a second optical amplifier 64 before being modulated a second time by the third optical modulator 56 with an applied RF signal 66. At this point, the path 52 with the cascaded optical modulators 54 and 56 contains wavelengths at the fundamental frequency (1550 nm) 32, the fundamental +18 GHz, the fundamental ±RF input frequency 66, and the fundamental ±18 GHz ±RF input 66. The light 68 is amplified in a third optical amplifier 72 and passed through an optical filter 74 that selects one of the optical sidebands. However, instead of a single optical filter 74, multiple optical filters in each signal path 44 and 52 may be used. The two paths 44 and 52 are then recombined in a second 3 dB polarization maintaining (PM) optical coupler 76, the beat signal produced by heterodyning the light at the filtered signal 78 with the sideband produced by LO1 48 is detected and an intermediate frequency (IF) output 82 is applied to an optical transmission line for application to user electronics (not shown) at a remote location.

The optical modulators, MZM1 46, MZM2 54 and MZM3 56, are preferably Mach-Zehnder type optical modulators or phase modulators, however, it is well known to those skilled in the art that other types of optical modulators capable of generating optical sidebands may be utilized. The optical amplifiers, AMP1 33, AMP2 64 and AMP3 78, are preferably Erbium doped fiber amplifiers (EDFA), however, it is recognized by those skilled in the art that other types on amplifiers may be utilized as long as they are capable of maintaining the polarization of light. If a high power laser source 34 is used, the first optical amplifier AMP1 33 may not be required. All-optical amplifiers are optional and may be omitted depending on the performance required.

The RF input powers of LO1 48 and LO2 58 were fixed to 30 dBm, however, lower powers may be utilized. PM fiber is required for this system up to the second optical fiber coupler 76, however, single mode optical fiber may be substituted for the PM fiber with the proper placement of polarization controllers, or with the use of polarization independent modulators.

In a second preferred embodiment, an optical image reject down converter 20, having a polarization diverse scheme is possible at the system output, as shown in FIG. 5, this would relax the requirement of a PM fiber. PM fiber would only be required up to the light modulators in each link or within the dashed box 92. Also, a polarizing beam splitter 86 to direct the IF signal 82 having a differing phase relationships 84 and 88 to an optical transmission line for application to user electronics at a remote location.

In an experimental test to verify the functionality of the wideband image rejection system as described above, the conversion loss (CL), and image rejection capability of the system were measured. FIG. 5 shows the power of the converted signals versus the RF input frequency. The converted signal power was 30–40 dB (CL=30–40 dB) below the +20 dBm RF input power. The variation in the CL was found to be due in part to the throughput of the optical filter, which was set to a fixed value for each LO2 58. Lower conversion losses resulted from frequency shifts near to the center wavelength of the optical filter.

Next the image rejection properties of the system 10 were measured. The RF frequencies in the image band of each local oscillator, LO1 48 and LO2 58, frequency combination were rejected. As shown in FIG. 5, the converted image signals were 20–30 dB below that of the described signals. The image rejection performance of this system 10 is typical of the performance reported using other optical mixing techniques, and is a function of the optical filters 74 extinction.

The invention described herein is an all optical image rejection system that provides a unique and novel improvement to the efficiency of image-rejection frequency shifters and mixers and is an improvement over the hybrid RF/optical image rejection mixers in the prior art, since no electrical mixers are used and that optical phase modulators may be used. More than 20 dB of image rejection, dependent upon the efficiency of the optical bandpass filter utilized, has been shown. Ultra wideband microwave frequency bands may be mapped into narrow frequency bands to simplify processing and the large image rejection capability of this invention allows the precise determination of frequency for direction finding applications. Also this invention allows a method to shift frequency for radar applications.

Although the invention has been described in relation to an exemplary embodiment thereof, it will be understood by those skilled in the art that still other variations and modifications can be affected in the preferred embodiment without detracting from the scope of the invention as described in the claims.

What is claimed is:

1. An all-optical image reject downconverter comprised of:
    an optical light source providing optical light;
    a first optical path wherein the optical light is transferred into a first optical sideband frequency by an optical modulator;
    a second optical path wherein the optical light is transferred into a second predetermined sideband frequency by a second optical modulator;
    said second modulated optical light being further modulated by a predetermined radio frequency signal in a third optical modulator producing an output signal containing many optical wavelengths;
    said optical signal containing many optical wavelengths is passed through a narrow tunable optical filter to filter out all signals except a predetermined sideband frequency; and
    means for recombining the first path and second path optical signals whereupon the filtered optical signal is heterodyned with the modulated optical signal from the first optical path to produce downconverted intermediate frequency optical signal without unwanted image signals and an unwanted sideband; and
    said downconverted intermediate optical signal being transmitted over an optical fiber circuit to remotely located user electronics.

2. A downconverter, as in claim 1, wherein the optical light source is any light source that can be used to downconvert radio frequency frequencies through optical heterodyning.

3. A downconverter, as in claim 1, wherein the optical light source is a fiber coupled laser.

4. A downconverter, as in claim 3, wherein the laser is of any wavelength.

5. A downconverter, as in claim 3, wherein the laser is a high power laser producing such an output optical light that no amplification is required on the optical signals transiting the first and second paths within the downconverter.

6. A downconverter, as in claim 1, further comprising an optical coupler for dividing the optical light from the optical light source into two paths.

7. A downconverter, as in claim 1, wherein the optical modulators are any type capable of generating optical sidebands.

8. A downconverter, as in claim 1, wherein the optical modulators are Mach-Zehnder optical modulators.

9. A downconverter, as in claim 1, wherein the optical modulators are phase modulators.

10. A downconverter, as in claim 1, further comprising optical amplifiers for amplifying the optical signals within the downconverter.

11. A downconverter, as in claim 10, wherein said optical amplifiers are Erbium doped fiber amplifiers.

12. A downconverter, as in claim 10, wherein the amplifiers are any amplifier capable of maintaining polarization of light.

13. A downconverter, as in claim 1, wherein the optical filter is any type with a bandwidth and extinction meeting designer requirements.

14. An all-optical image reject downconverter for converting a received radio frequency signal into a signal comprised of:
    an optical light source providing optical light;
    said optical light being divided into a first optical light path and a second optical light path;
    a first optical modulator for modulating the optical light in the first path with a local oscillator signal;
    a second optical modulator for converting the optical light in the second optical path into optical sidebands;
    a third optical modulator generating additional sidebands by a received radio frequency signal;
    a tunable narrow bandwidth optical filter which passes only a desired optical sideband signal; and
    a coupler for heterodyning the desired optical sideband signal in the second optical path with the optical signal in the first optical path to produce a downconverted signal; and
    an optical transmission line for transmitting the downconverted optical signal to remote user electronics.

15. A method for mapping of received radio frequency signals into arbitrary intermediate frequency range optical signals precluding interference between the received signals comprising:
    step of generating an optical light;
    step of dividing said optical light into a first path and a second path;
    step of transferring the optical light in said first path into an optical sideband by modulating it with a first local oscillator frequency;
    step of converting the light in the second path into predetermined frequency sidebands by modulating it with a second local oscillator frequency;
    step of amplifying and generating additional sidebands in the second path by a predetermined electrical frequency;
    step of passing the amplified optical light in the second light path through a narrow-band tunable optical filter to remove all optical frequencies present except a predetermined optical sideband frequency thereby producing a filtered optical light signal; and
    step of heterodyning the filtered optical light signal with the modulated optical signal from the first path to produce a downconverted optical signal usable by an electronic circuit.

* * * * *

UNITED STATES PATENT AND TRADEMARK OFFICE
CERTIFICATE OF CORRECTION

PATENT NO. : 6,487,004 B1
DATED : November 26, 2002
INVENTOR(S) : Strutz et al.

It is certified that error appears in the above-identified patent and that said Letters Patent is hereby corrected as shown below:

<u>Title page,</u>
Item [74], *Attorney, Agent, or Firm*, "John G. Mills, III" should read -- John Gladstone Mills III --

Signed and Sealed this

Sixth Day of July, 2004

JON W. DUDAS
*Acting Director of the United States Patent and Trademark Office*